(12) United States Patent
Akamine et al.

(10) Patent No.: US 12,294,338 B2
(45) Date of Patent: May 6, 2025

(54) OUTPUT MATCHING CIRCUIT AND POWER AMPLIFIER CIRCUIT

(71) Applicant: Murata Manufacturing Co., Ltd., Kyoto (JP)

(72) Inventors: Hitoshi Akamine, Kyoto (JP); Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 616 days.

(21) Appl. No.: 17/457,290

(22) Filed: Dec. 2, 2021

(65) Prior Publication Data

US 2022/0182025 A1    Jun. 9, 2022

(30) Foreign Application Priority Data

Dec. 4, 2020  (JP) ................. 2020-201703

(51) Int. Cl.
| | |
|---|---|
| *H03F 3/191* | (2006.01) |
| *H03F 1/56* | (2006.01) |
| *H03F 3/195* | (2006.01) |
| *H03F 3/24* | (2006.01) |
| *H04B 1/04* | (2006.01) |

(52) U.S. Cl.
CPC ............ *H03F 3/245* (2013.01); *H03F 1/565* (2013.01); *H03F 3/195* (2013.01); *H04B 1/0458* (2013.01); *H03F 2200/168* (2013.01); *H03F 2200/171* (2013.01); *H03F 2200/318* (2013.01); *H03F 2200/451* (2013.01); *H03F 2200/543* (2013.01)

(58) Field of Classification Search
CPC .......... H03F 3/245; H03F 1/565; H03F 3/195; H03F 2200/168; H03F 2200/171; H03F 2200/318; H03F 2200/451; H03F 2200/543; H03F 2200/301; H03F 2200/309; H03F 2200/315; H03F 2200/402; H03F 2200/423; H03F 3/213; H04B 1/0458
USPC ......................................................... 330/302
See application file for complete search history.

(56) References Cited

U.S. PATENT DOCUMENTS

| | | | |
|---|---|---|---|
| 7,202,734 B1 * | 4/2007 | Raab .......................... | H03F 3/04 330/306 |
| 8,384,484 B2 * | 2/2013 | Winslow ................. | H03F 1/565 330/195 |
| 11,522,503 B2 * | 12/2022 | Hase ......................... | H03F 1/56 |
| 2016/0294333 A1 | 10/2016 | Feng et al. | |

FOREIGN PATENT DOCUMENTS

JP    2016-195393 A    11/2016

* cited by examiner

*Primary Examiner* — Khanh V Nguyen
(74) *Attorney, Agent, or Firm* — McDonald Hopkins LLC

(57) ABSTRACT

An output matching circuit includes: a converter electrically connected to an output end of a power amplifier element to convert an impedance of the output end to an impedance higher than the impedance of the output end by magnetic coupling; and a first filter circuit electrically connected between the output end of the power amplifier element and the converter to make a short circuit in a frequency band different from a predetermined transmission frequency band.

15 Claims, 11 Drawing Sheets

OUTPUT MATCHING CIRCUIT AND POWER AMPLIFIER CIRCUIT

This application claims priority from Japanese Patent Application No. 2020-201703 filed on Dec. 4, 2020. The content of this application is incorporated herein by reference in its entirety.

BACKGROUND

The present disclosure relates to output matching circuits and power amplifier circuits.

In mobile communication terminals such as mobile phones, a power amplifier circuit for amplifying radio frequency (RF) signals to be transmitted to a base station is used. To improve its efficiency, the power amplifier circuit includes a harmonic wave termination circuit (for example, Japanese Unexamined Patent Application Publication No. 2016-195393).

BRIEF SUMMARY

The disclosure described in Japanese Unexamined Patent Application Publication No. 2016-195393 achieves a class-F or inverse class-F power amplifier circuit by switching the frequency by switching the capacitor of the harmonic wave termination circuit with a switch. However, in the harmonic wave termination circuit of the disclosure described in Japanese Unexamined Patent Application Publication No. 2016-195393, sufficient attenuation cannot be obtained depending on the conditions of impedance prior to and subsequent to the harmonic wave termination circuit and the conditions of elements electrically connected prior to and subsequent to the harmonic wave termination circuit, and thus losses may be large in a frequency band desired to be passed.

The present disclosure suppresses losses in a frequency band desired to be passed in a power amplifier circuit and ensure attenuation at a frequency desired to be attenuated.

An output matching circuit according to an aspect of the present disclosure includes: a converter electrically connected to an output end of a power amplifier element to convert an impedance of the output end to an impedance higher than the impedance of the output end by magnetic coupling; and a first filter circuit electrically connected between the output end of the power amplifier element and the converter to make a short circuit in a frequency band different from a predetermined transmission frequency band.

According to the present disclosure, losses in a frequency band desired to be passed in a power amplifier circuit can be suppressed, and attenuation can be sufficiently ensured at a frequency desired to be attenuated.

DETAILED DESCRIPTION

Figure 1:
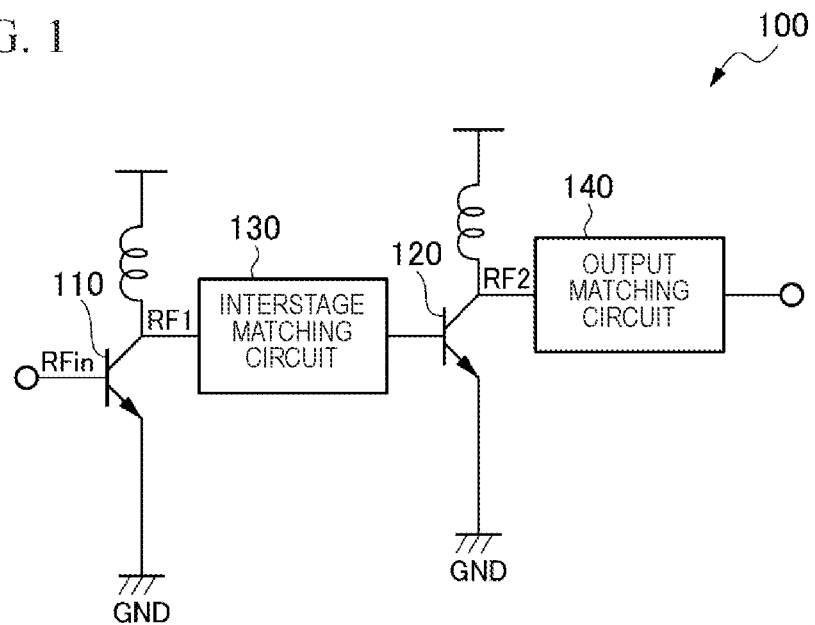
FIG. 1 is a diagram depicting a general outline of the structure of a power amplifier circuit.

In the following, each embodiment of the present disclosure is described with reference to each of the drawings. Here, circuit elements with the same reference character represent the same circuit element, and redundant description is omitted.

===Structure of Power Amplifier Circuit 100===

With reference to FIG. 1, the structure of a power amplifier circuit 100 is described. FIG. 1 is a diagram depicting a general outline of the structure of the power amplifier circuit 100. The power amplifier circuit 100 is mounted on, for example, a mobile communication machine such as a mobile phone, and amplifies electric power of an input signal RFin to a level required for transmission to a base station and outputs this as an amplified signal RFout. The input signal RFin is a radio frequency (RF) signal modified in accordance with a predetermined communication scheme by, for example, a radio frequency integrated circuit (RFIC) or the like. The communication standards for the input signal RFin include, for example, 2nd Generation Mobile Communication System (2G), 3rd Generation Mobile Communication System (3G), 4th Generation Mobile Communication System (4G), 5th Generation Mobile Communication System (5G), Long Term Evolution-Frequency Division Duplex (LTE-FDD), LTE-TDD (Time Division Duplex), LTE-Advanced, or LTE-Advanced Pro, and so forth, and the frequency is, for example, on the order of several hundreds of MHz to several tens of GHz. Note that the communication standards and the frequency of the input signal RFin are not limited to these.

As depicted in FIG. 1, the power amplifier circuit 100 includes, for example, power amplifier elements 110 and 120, an interstage matching circuit 130, and an output matching circuit 140. Note that while the power amplifier circuit 100 is disclosed as configured of two stages in the present embodiment, the power amplifier circuit 100 may be configured of one stage or three or more stages. In that case, a plurality of power amplifier elements and a plurality of interstage matching circuits are added to the power amplifier circuit 100.

The power amplifier elements 110 and 120 each amplifies and outputs an inputted RF signal. The power amplifier element 110 amplifies the input signal RFin inputted from an input terminal and outputs an RF signal RF1. The power amplifier element 120 amplifies the RF signal RF1 through the interstage matching circuit 130 and outputs an RF signal RF2 (amplified signal). The power amplifier elements 110 and 120 are each configured of a transistor, for example, a heterojunction bipolar transistor (HBT) or the like. Note that the power amplifier elements 110 and 120 may be each configured of an electric field effect transistor (metal-oxide-semiconductor field-effect transistor) in place of the HBT. In this case, the collector, the base, and the emitter are only required to be read as the drain, the gate, and the source. Note that, by way of example, a case is described below in which the transistor is configured of an HBT, unless otherwise specified.

The interstage matching circuit 130 is, for example, a circuit for matching impedance between the output end (collector) of the power amplifier element 110 and the input end (base) of the power amplifier element 120.

The output matching circuit 140 is a circuit for matching impedance between the output end (collector) of the power amplifier element 120 and load. Further, for example, the output matching circuit 140 can suppress losses in the pass band of the RF signal RF2, and provides the power amplifier circuit 100 with wide-band characteristics. In the following, the output matching circuit 140 is described in detail.

Structure of Output Matching Circuit 140
According to First Embodiment

Figure 2:
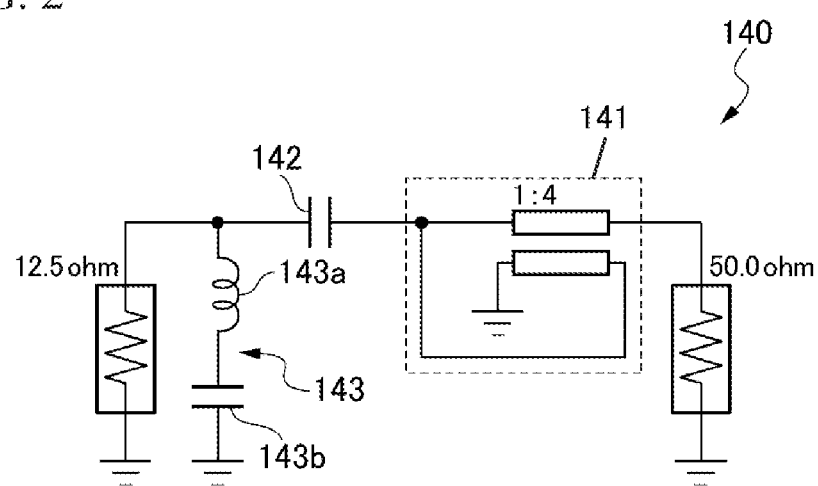
FIG. 2 is a diagram depicting one example of the structure of an output matching circuit according to a first embodiment.

With reference to FIG. 2, the structure of an output matching circuit 140 according to a first embodiment is described. FIG. 2 is a diagram depicting one example of the structure of the output matching circuit 140 according to the first embodiment. Note that in FIG. 2, for convenience, by way of example, the impedance of the input end is set at 12.5 ohms and the impedance of the output end is set at 50.0 ohms. As depicted in FIG. 2, the output matching circuit 140 includes, for example, a converter 141, a coupling capacitor 142, and a first filter circuit 143.

The converter 141 is a converter for converting impedance by magnetic coupling and is, for example, a transmission line transformer. The transmission line transformer is, for example, a circuit for converting impedance at a predetermined conversion ratio. By the transmission line transformer, the output matching circuit 140 can perform wide-band low-loss impedance conversion. In FIG. 2, by way of example, the conversion ratio of the converter 141 is set at "1:4". That is, for example, the output matching circuit 140 converts the impedance at the input end of 12.5 ohms to the impedance at the output end of 50.0 ohms through the converter 141.

The coupling capacitor 142 is, for example, a capacitor electrically connected to the input terminal of the converter 141 in series to break direct-current components, thereby matching the first filter circuit 143 and the converter 141 which will be described below.

The first filter circuit 143 is, for example, a circuit which makes a short circuit in a first frequency band different from a transmission frequency band (which may be hereinafter also referred to as a pass band) indicated by the RF signal RF2. "Short circuit" is a state in which, for example, a first inductor 143a and a first capacitor 143b configuring the first filter circuit 143 resonate in the first frequency band, thereby causing the imaginary part of a complex impedance or complex reflection coefficient in consideration of the first filter circuit 143 to become 0. The first filter circuit 143 includes, for example, the first inductor 143a and the first capacitor 143b to form a series resonant circuit. The first inductor 143a and the first capacitor 143b are, for example, electrically connected in series. The first filter circuit 143 has, for example, one end electrically connected to a node between the converter 141 (or the coupling capacitor 142) and the collector of the power amplifier element 120 and the other end connected to the ground. That is, the first filter circuit 143 derives the RF signal RF2 in the first frequency band to the ground. Note that the first filter circuit 143 may be connected to the collector of the power amplifier element 120 through, for example, any impedance conversion circuit (not depicted). Further, the first frequency band may be of double harmonic waves of the transmission frequency band. This allows the output matching circuit 140 to trap harmonic waves, which greatly affect the frequency characteristics, and thus losses in the power amplifier circuit 100 can be suppressed.

Figure 3:
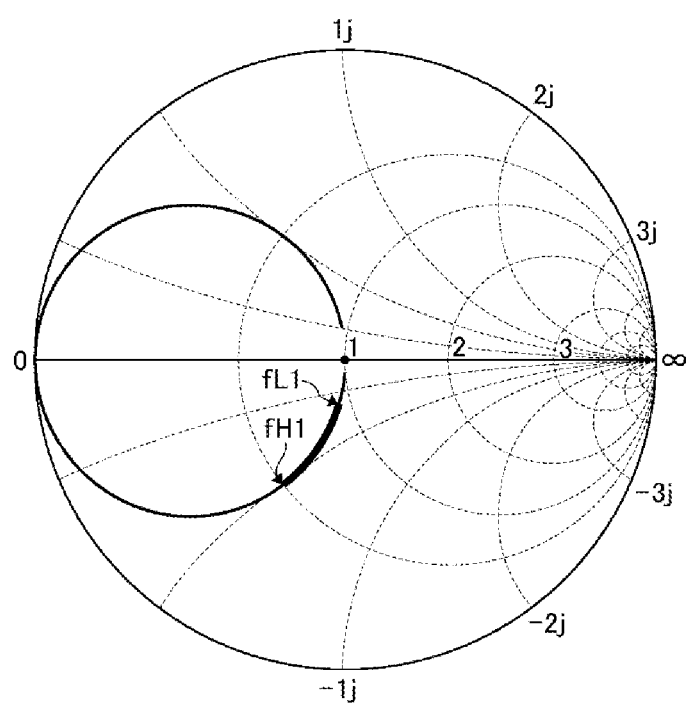
FIG. 3 is a Smith chart when a first filter circuit is electrically connected at a location with an impedance of 12.5 ohms.
Figure 4:
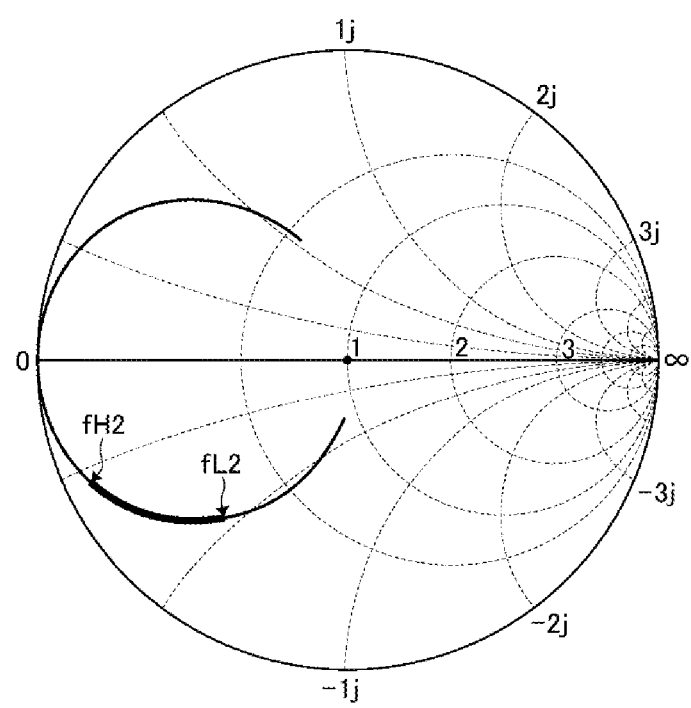
FIG. 4 is a Smith chart when the first filter circuit is electrically connected at a location with an impedance of 50.0 ohms.

Here, with reference to FIG. 2, FIG. 3, and FIG. 4, a mechanism is described in which losses in the power amplifier circuit 100 can be reduced by the output matching circuit 140. FIG. 3 is a Smith chart when the first filter circuit 143 is electrically connected at a location with an impedance of 12.5 ohms. FIG. 4 is a Smith chart when the first filter circuit 143 is electrically connected at a location with an impedance of 50.0 ohms.

As depicted in FIG. 2, in the output matching circuit 140, the first filter circuit 143 is electrically connected to a low impedance side of the converter 141. A change amount (for example, fL1 to fH1 in FIG. 3) of impedance with respect to frequency in the output matching circuit 140 when the first filter circuit 143 is connected to a low impedance location (here, 12.5 ohms) is smaller than a change amount (for example, fL2 to fH2 in FIG. 4) of impedance with respect to frequency in the output matching circuit 140 when the first filter circuit 143 is connected to a high impedance location (here, 50.0 ohms). That is, as depicted in FIG. 2, with the first filter circuit 143 electrically connected to the low impedance side of the converter 141, the range of changes in impedance in the pass band can be decreased and, furthermore, can be brought closer to the center point with a reflection coefficient of 0 in a Smith chart depicted in FIG. 3. In this state, the converter 141 converts impedance. This allows impedance to be matched in the pass band, and thus losses in the power amplifier circuit 100 can be reduced.

Figure 5:
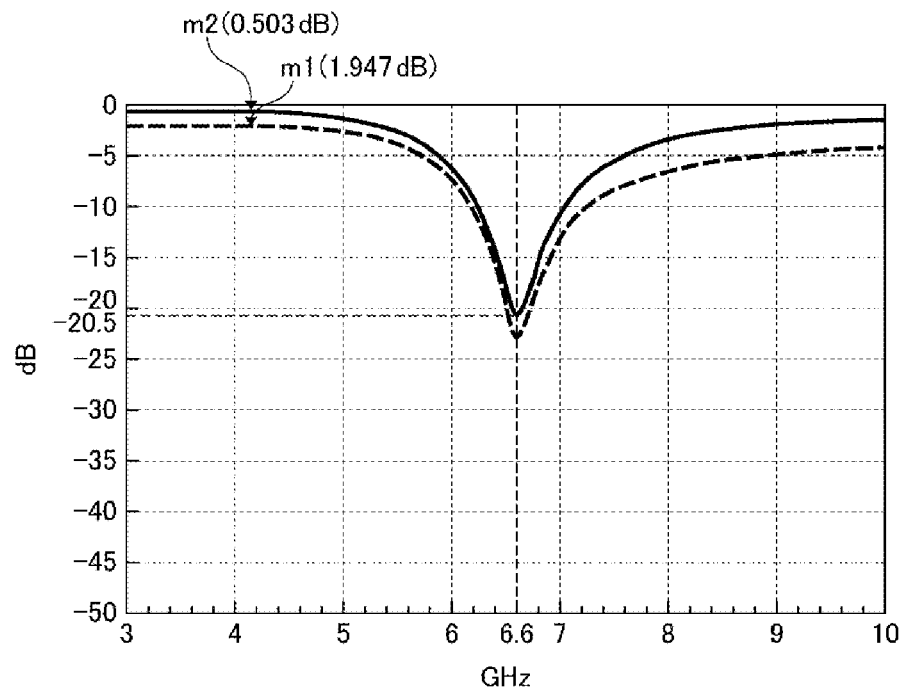
FIG. 5 is a graph comparably depicting frequency characteristics when a λ/4 line is used and frequency characteristics when a transmission line transformer for converting impedance by magnetic coupling is used, as a converter.
Figure 6:
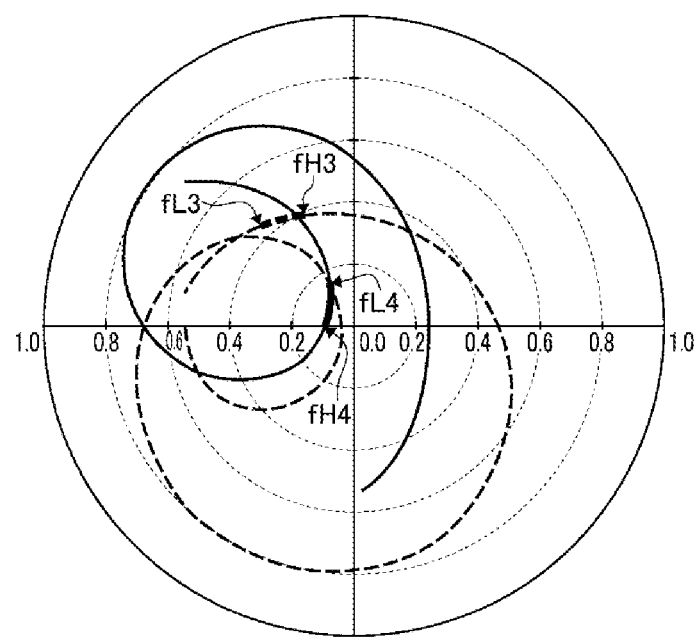
FIG. 6 is a polar chart comparably depicting reflection coefficients when the λ/4 line is used as a converter and reflection coefficients when the transmission line transformer is used as a converter.

With reference to FIG. 5 and FIG. 6, effectiveness of using a transmission line transformer as the converter 141 in the output matching circuit 140 is described.

FIG. 5 is a graph comparably depicting frequency characteristics when a λ/4 line is used and frequency characteristics when a transmission line transformer for converting impedance by magnetic coupling is used, as the converter 141. In FIG. 5, the horizontal axis represents frequency (GHz), and the vertical axis represents attenuation (dB). In FIG. 5, "m1" represents attenuation at a frequency of 4.2 GHz when the λ/4 line is used, and "m2" represents attenuation at a frequency of 4.2 GHz when the transmission line transformer is used. Note that in FIG. 5, frequency characteristics (broken line) when the λ/4 line is used as the converter 141 are frequency characteristics when the first filter circuit 143 is connected after the impedance and the length of the λ/4 line are adjusted so that 12.5 ohms can be converted to 50.0 ohms in the λ/4 line.

FIG. 6 is a polar chart comparably depicting reflection coefficients when the λ/4 line is used as the converter 141 and reflection coefficients when the transmission line transformer is used as the converter 141. In FIG. 6, the horizontal axis and the vertical axis represent reflection coefficients, and the center point of the polar chart is taken as a reflection coefficient of "0". That is, the reflection coefficient is smaller as closer to the center point of the polar chart, indicating that it is closer to 50.0 ohms at the output end. In other words, this indicates that output matching is better as the reflection coefficient is closer to the center point of the polar chart. Further, an angle which the center point of the polar chart forms with a plot point represents a phase. In FIG. 6, "fL" represents a frequency (here, frequency of 3.3 GHz) in a lower transmission frequency band, and "fH" represents a frequency (here, frequency of 4.2 GHz) in a higher transmission frequency band. In the following, for convenience, "fL" is set at a frequency of 3.3 GHz, and "fH" is set at a frequency of 4.2 GHz. Further, in FIG. 6, a frequency band between "fL" and "fH" is indicated by a bold line.

As depicted in FIG. 5, in the first filter circuit 143, the resonance point (here, near a frequency of 6.6 GHz) when the λ/4 line is used and the resonance point (here, near a frequency of 6.6 GHz) when the transmission line transformer is used have substantially the same attenuation (here, approximately −20.5 dB). However, as depicted in FIG. 6, the reflection coefficient in a pass band (for example, fL3 to fH3) when the λ/4 line is used has a value whose absolute value is larger than that of the reflection coefficient in a pass band (for example fL4 to fH4) when the transmission line transformer is used. That is, in the pass band, the reflection coefficient diverges from 50.0 ohms when the λ/4 line is used more than when the transmission line transformer is used. This is evident also from attenuation of "1.947 dB" indicated by "m1" and attenuation of "0.503 dB" indicated by "m2" corresponding to the frequency of 4.2 GHz in FIG. 5. This allows losses in the power amplifier circuit 100 to be suppressed by using the converter 141 for converting impedance by magnetic coupling.

Structure of Output Matching Circuit 240
According to Second Embodiment

Figure 7:
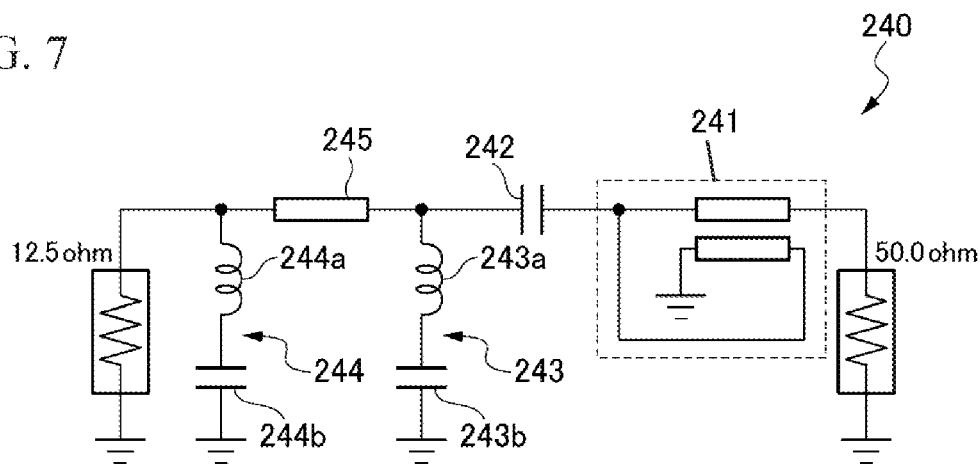
FIG. 7 is a diagram depicting one example of the structure of an output matching circuit according to a second embodiment.
Figure 8:
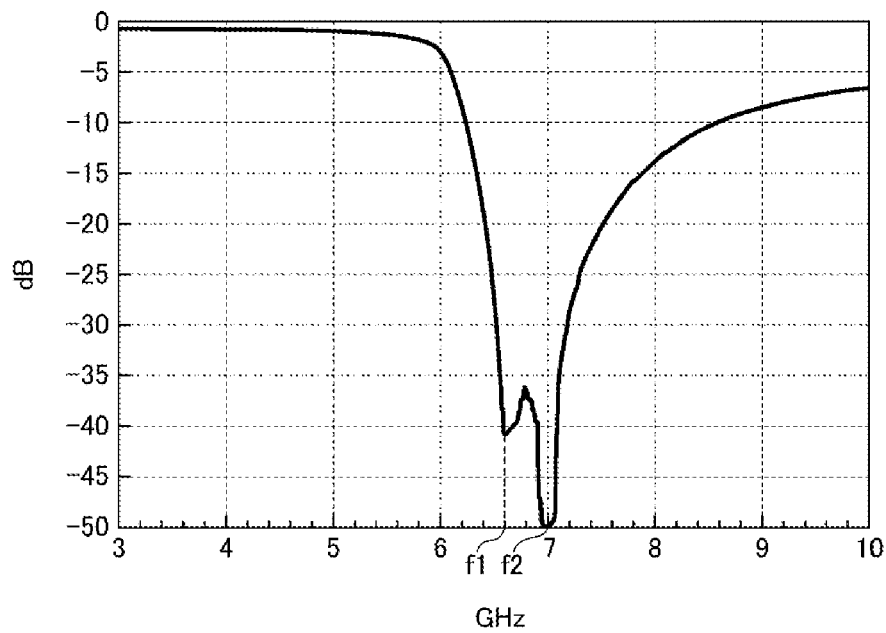
FIG. 8 is a graph depicting frequency characteristics of the output matching circuit according to the second embodiment.

With reference to FIG. 7 and FIG. 8, the structure of an output matching circuit 240 according to a second embodiment is described. FIG. 7 is a diagram depicting one example of the structure of the output matching circuit 240 according to the second embodiment. Note that in FIG. 7, by way of example, the impedance of the input end is set at 12.5 ohms and the impedance of the output end is set at 50.0 ohms. FIG. 8 is a graph depicting frequency characteristics of the output matching circuit 240 according to the second embodiment.

As depicted in FIG. 7, the output matching circuit 240 includes, for example, a converter 241, a coupling capacitor 242, a first filter circuit 243, a second filter circuit 244, and a transmission line 245. The converter 241, the coupling capacitor 242, and the first filter circuit 243 of the output matching circuit 240 are identical to the converter 141, the coupling capacitor 142, and the first filter circuit 143 of the output matching circuit 140, and therefore their description is omitted. That is, the output matching circuit 240 is one with the second filter circuit 244 and the transmission line 245 added to the output matching circuit 140. This allows the output matching circuit 240 to ensure attenuation in the pass band and suppress losses.

The second filter circuit 244 is, for example, a circuit which makes a short circuit in a second frequency band different from a transmission frequency band indicated by the RF signal RF2. The second frequency band is, for example, a frequency band higher than the first frequency band of the first filter circuit 243. The second filter circuit 244 includes, for example, a second inductor 244*a* and a second capacitor 244*b* to form a series resonant circuit. The second inductor 244*a* and the second capacitor 244*b* are, for example, electrically connected in series. The second filter circuit 244 has, for example, one end electrically connected to a node between the transmission line 245, which will be described below, and the collector of a power amplifier element 220 (not depicted) and the other end connected to the ground. That is, the second filter circuit 244 derives the RF signal RF2 in the second frequency band to the ground. The second frequency band may be of triple harmonic waves of the transmission frequency band. This allows the output matching circuit 240 to trap harmonic waves, which greatly affect the frequency characteristics, and thus losses in the power amplifier circuit 100 can be suppressed.

The transmission line 245 is, for example, a line for converting the phase of the RF signal RF2. The transmission line 245 may be, for example, a line with an electrical length of 67.5 degrees of the center frequency. Note that the electrical length of the transmission line 245 is not limited to 67.5 degrees and, for example, the electrical length may be in a range of 67.5 degrees±10 degrees. The transmission line 245 is electrically connected between the first filter circuit 243 and the second filter circuit 244. This allows, as depicted in FIG. 8, the resonant frequency (here, f1) of the first filter circuit 243 and the resonant frequency (here, f2) of the second filter circuit 244 to be added and combined, and thus the frequency band to be attenuated can be widened.

Figure 9:
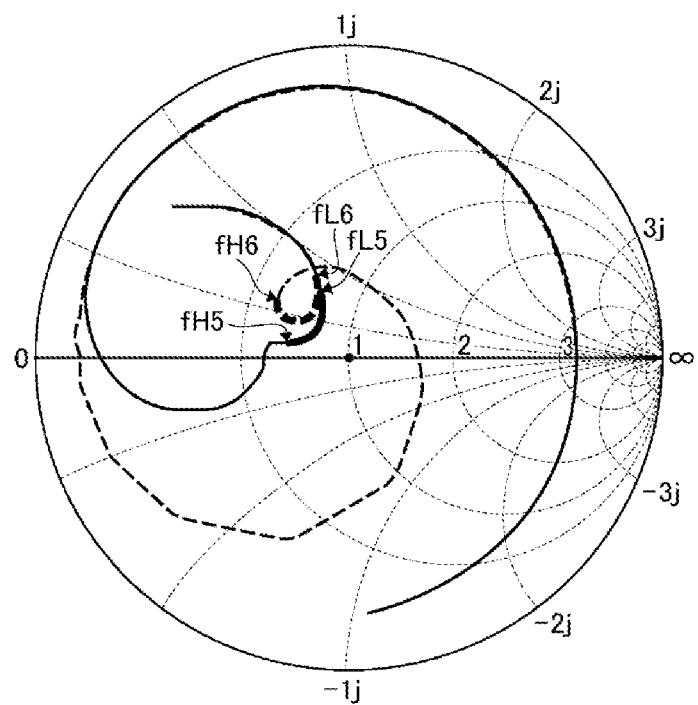
FIG. 9 is a Smith chart depicting impedance in the output matching circuit according to the second embodiment.

Here, with reference to FIG. 9, it is described that the connection relation between the first filter circuit 243 and the second filter circuit 244 in the output matching circuit 240 is desired to be the above-described connection relation (hereinafter referred to as "before interchange"). FIG. 9 is a Smith chart depicting impedance in the output matching circuit 240 according to the second embodiment. In FIG. 9, changes in impedance before interchange are indicated by a solid line, and changes in impedance when the first filter circuit 243 and the second filter circuit 244 are interchanged in position (hereinafter referred to as "after interchange") are indicated by a broken line. That is, "after interchange" means that the second filter circuit 244 with a high frequency band to be trapped is electrically connected between the first filter circuit 243 with a low frequency band to be trapped and the converter 241 in the output matching circuit 240. In FIG.

9, "fL5" represents a frequency (here, frequency of 3.3 GHz) in a lower transmission frequency band before interchange, and "fH5" represents a frequency (here, frequency of 5.0 GHz) in a higher transmission frequency band before interchange. Further, "fL6" represents a frequency (here, frequency of 3.3 GHz) in a lower transmission frequency band after interchange, and "fH6" represents a frequency (here, frequency of 5.0 GHz) in a higher transmission frequency band after interchange.

As depicted in FIG. 9, the changes in impedance before interchange indicated by the solid line are closer to the center of the Smith chart (here, impedance of 50.0 ohms) than the changes in impedance after interchange indicated by the broken line. Thus, impedance matching in the output matching circuit 240 before interchange can be evaluated as more favorable than that after interchange. Thus, the output matching circuit 240 is desired to have the first filter circuit 243 and the second filter circuit 244 connected as before interchange.

Figure 10:
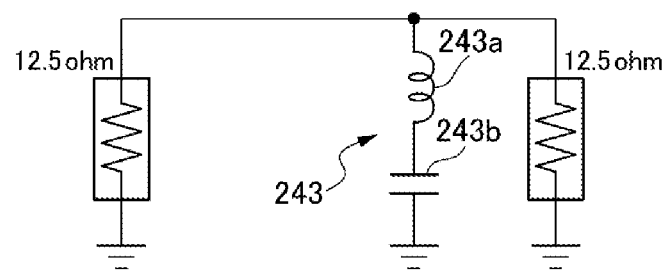
FIG. 10 is a diagram depicting a first connection state in which a first filter circuit is provided.
Figure 11:
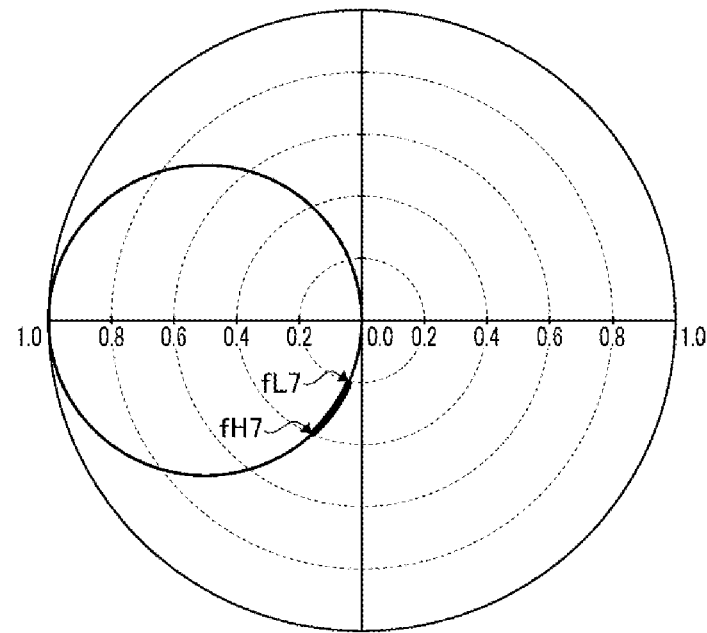
FIG. 11 is a polar chart depicting reflection coefficients with respect to the frequencies of an RF signal in the first connection state.
Figure 12:
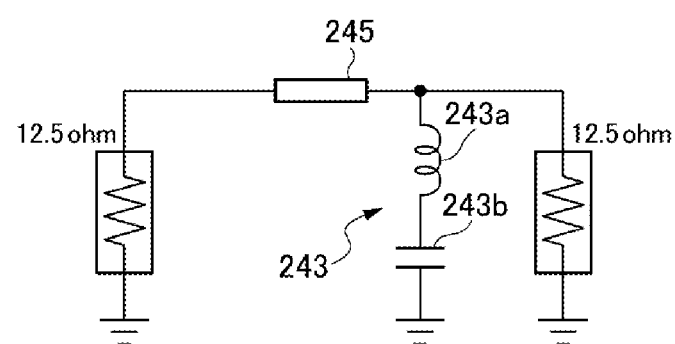
FIG. 12 is a diagram depicting a second connection state in which the first filter circuit and a transmission line are provided.
Figure 13:
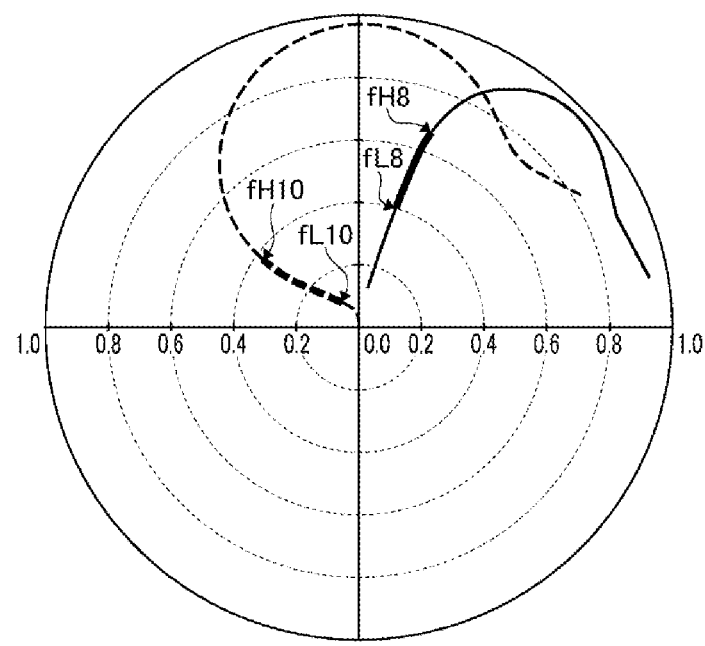
FIG. 13 is a polar chart depicting reflection coefficients with respect to the frequencies of an RF signal in the second connection state.
Figure 14:
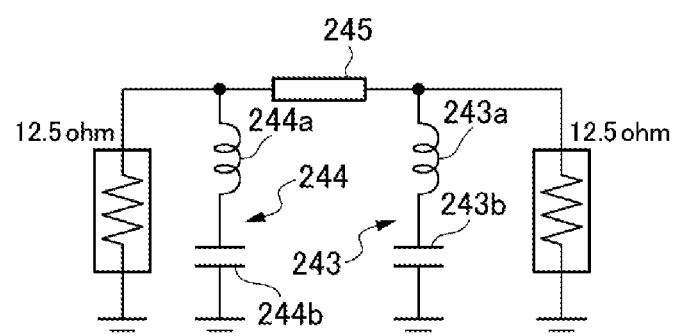
FIG. 14 is a diagram depicting a third connection state in which the first filter circuit, a second filter circuit, and the transmission line are provided.
Figure 15:
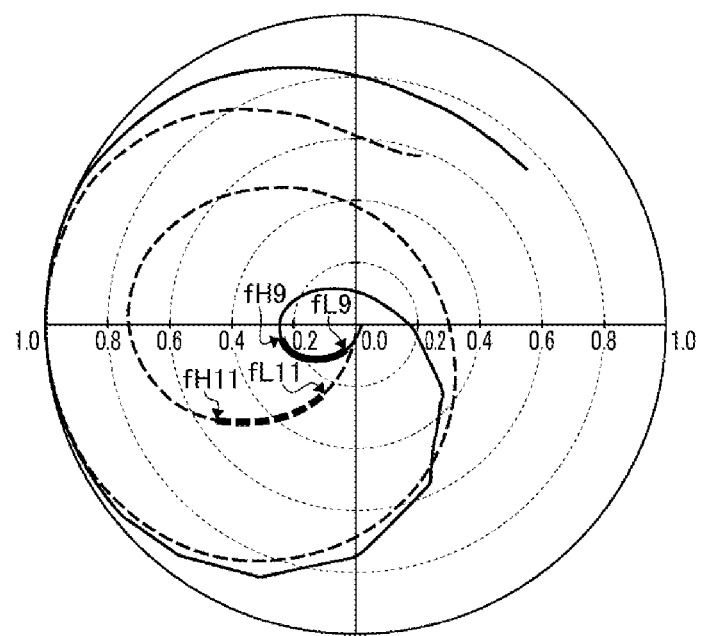
FIG. 15 is a polar chart depicting reflection coefficients with respect to the frequencies of an RF signal in the third connection state.

Next, with reference to FIG. 10 to FIG. 15, it is described that in the output matching circuit 240, in order to suppress losses, the range of impedance is decreased and the impedance is brought closer to 50.0 ohms. In the following, for convenience, the range of impedance is described for the output matching circuit 240 with an impedance of 12.5 ohms at the termination before impedance conversion when the second filter circuit 244 and the transmission line 245 are added to the first filter circuit 243 at predetermined position. FIG. 10 is a diagram depicting a first connection state in which the first filter circuit 243 is provided. FIG. 11 is a polar chart depicting reflection coefficients with respect to the frequencies of the RF signal RF2 in the first connection state. FIG. 12 is a diagram depicting a second connection state in which the first filter circuit 243 and the transmission line 245 are provided. FIG. 13 is a polar chart depicting reflection coefficients with respect to the frequencies of the RF signal RF2 in the second connection state. FIG. 14 is a diagram depicting a third connection state in which the first filter circuit 243, the second filter circuit 244, and the transmission line 245 are provided. FIG. 15 is a polar chart depicting reflection coefficients with respect to the frequencies of the RF signal RF2 in the third connection state.

Note that in FIG. 11, FIG. 13, and FIG. 15, for comparison, changes in the reflection coefficient when the transmission line 245 has an electrical length of 67.5 degrees are indicated by a solid line, and changes in the reflection coefficient when it has an electrical length of 45.0 degrees are indicated by a broken line. Further, in FIG. 10, FIG. 12, and FIG. 14, for convenience, the converter 241 and the coupling capacitor 242 are omitted.

Further, in FIG. 11, FIG. 13, and FIG. 15, "fL" represents a frequency in a lower transmission frequency band, and "fH" represents a frequency in a higher transmission frequency band. In the following, for convenience, "fL" is set at a frequency of 3.3 GHz, and "fH" is set at a frequency of 5.0 GHz. Further, in FIG. 11, FIG. 13, and FIG. 15, a frequency band between "fL" and "fH" is indicated by a bold line.

First, the changes in the reflection coefficient when the transmission line 245 has an electrical length of 67.5 degrees are described. In the first connection state depicted in FIG. 10, as depicted in FIG. 11, at the electrical length of 67.5 degrees, the reflection coefficient of fL7 is on the order of "0.20", and the reflection coefficient of fH7 is on the order of "0.45". Then, in the second connection state depicted in FIG. 12, as depicted in FIG. 13, at the electrical length of 67.5 degrees, the reflection coefficient of fL8 is on the order of "0.40", and the reflection coefficient of fH8 is on the order of "0.67". Then, in the third connection state depicted in FIG. 14, as depicted in FIG. 15, the reflection coefficient of fL9 is on the order of "0.05", and the reflection coefficient of fH9 is on the order of "0.25". This allows the range of impedance of the output matching circuit 240 to be narrowed to bring the impedance closer to 50.0 ohms, thereby allowing losses to be suppressed. Furthermore, by adjusting the electrical length of the transmission line 245, the impedance of the output matching circuit 240 can be adjusted, thereby allowing losses to be suppressed.

Next, as a comparative example, changes in the reflection coefficient when the transmission line 245 has an electrical length of 45.0 degrees are described. In the first connection state depicted in FIG. 10, the reflection coefficients at the electrical length of 45.0 degrees indicate reflective coefficients (fL7 and fH7) similar to those at the electrical length of 67.5 degrees. In the second connection state depicted in FIG. 12, as depicted in FIG. 13, at the electrical length of 45.0 degrees, the reflection coefficient of fL10 is on the order of "0.08", and the reflection coefficient of fH10 is on the order of "0.39". Then, in the third connection state depicted in FIG. 14, as depicted in FIG. 15, the reflection coefficient of fL11 is on the order of "0.22", and the reflection coefficient of fH11 is on the order of "0.53". That is, since the reflection coefficient in the transmission frequency band when the electrical length of the transmission line 245 is 45.0 degrees is at a position farther away from the center of the polar chart than the reflection coefficient in the transmission frequency band when the electrical length of the transmission line 245 is 67.5 degrees, losses are large.

Figure 16:
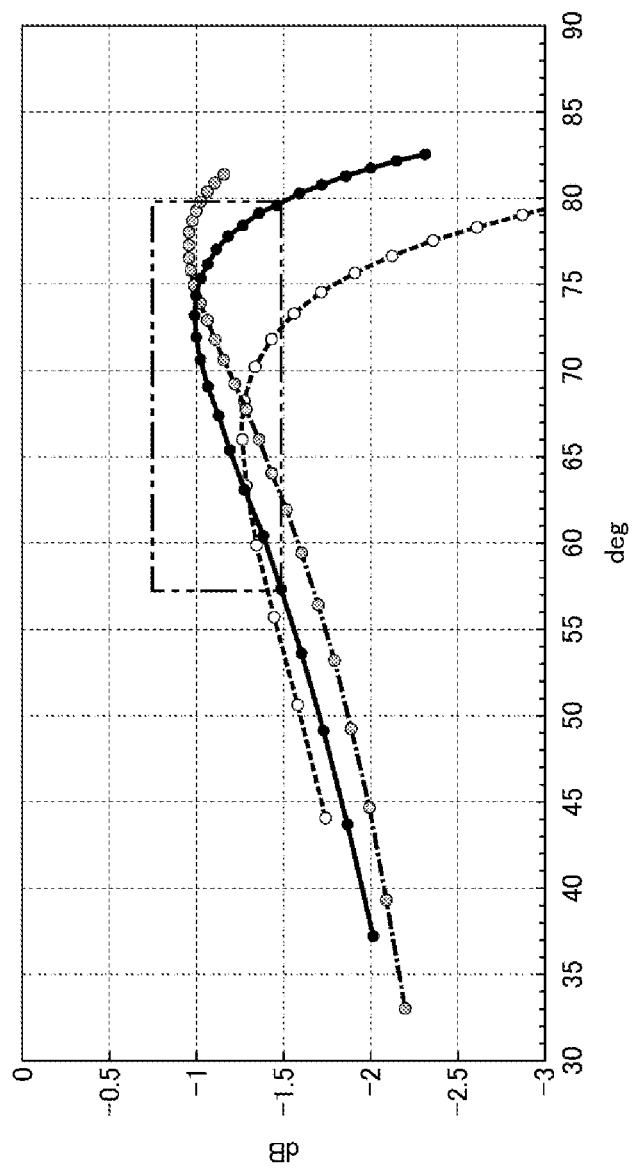
FIG. 16 is a graph depicting a relation between the electrical length at a predetermined characteristic impedance and loss in the transmission line in a transmission frequency band of 5 GHz.

With reference to FIG. 16, desirable values of the electrical length and the characteristic impedance in the transmission line 245 to reduce losses in the output matching circuit 240 are described. FIG. 16 is a graph depicting a relation between the electrical length at a predetermined characteristic impedance and loss in the transmission line 245 in a transmission frequency band of 5 GHz. In FIG. 16, the horizontal axis represents electrical length (deg), and the vertical axis represents loss (dB) at a frequency of 5 GHz. Further, in FIG. 16, by way of example, a solid line indicates a plot with a line width of the transmission line 245 of 30 μm and a characteristic impedance of 34 ohms, a broken line indicates a plot with a line width of the transmission line 245 of 10 μm and a characteristic impedance of 55 ohms, and a one-dot-chain line indicates a plot with a line width of the transmission line 245 of 50 μm and a characteristic impedance of 25 ohms. That is, FIG. 16 is a diagram in which the characteristic impedances corresponding to the line widths of the transmission line 245 are each plotted.

An area surrounded by a two-dot-chain line depicted in FIG. 16 is an area of allowable losses in the output matching circuit 240. As depicted in FIG. 16, by decreasing the line width, as the characteristic impedance increases, the electrical length at which losses start to increase is shortened. Specifically, for example, while the electrical length at which losses start to increase in the solid line is 73 degrees, the electrical length at which losses start to increase in the broken line is 66 degrees. Here, when the characteristic impedance decreases, losses decrease. However, when the characteristic impedance is decreased, the line width of the transmission line 245 has to be increased, and its electrical length has to be increased. Specifically, for example, while the electrical length is 73 degrees (width of 30 μm) when a loss in the solid line is −1.0 dB, the electrical length is 75 degrees (width of 50 μm) when a loss in the one-dot-chain line is −1.0 dB. That is, with reference to FIG. 16, in the transmission line 245, by way of example, when the transmission frequency band is 5.0 GHz, for example, it is desired that the characteristic impedance is 34 ohms and the electrical length is 67.5 degrees so that losses are not increased and the characteristic impedance is made appropriate.

Structure of Output Matching Circuit 340
According to Third Embodiment

Figure 17:
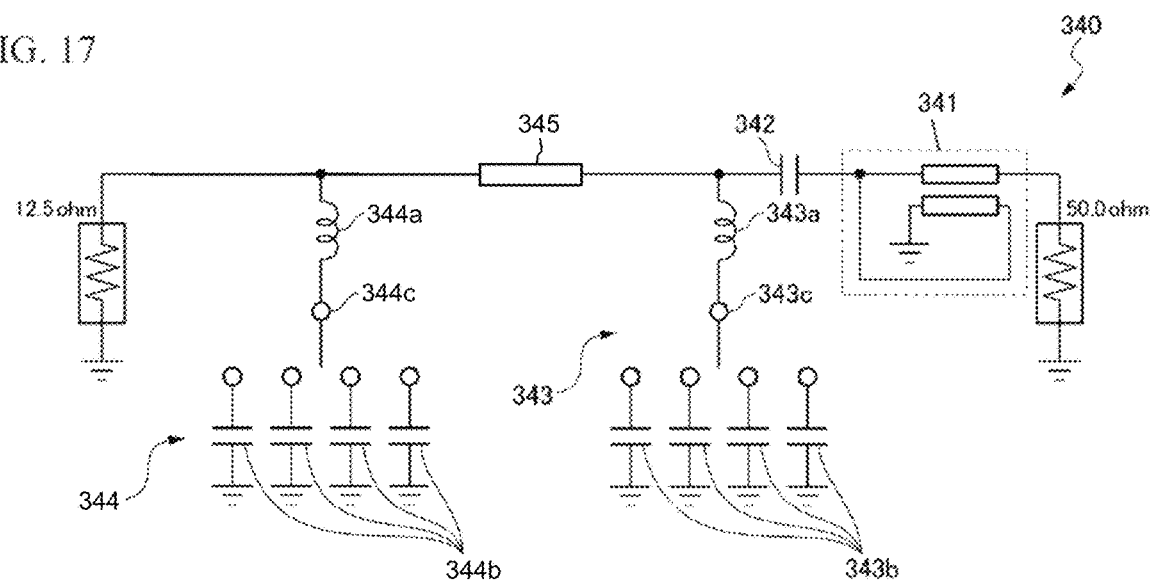
FIG. 17 is a diagram depicting one example of the structure of an output matching circuit according to a third embodiment.

With reference to FIG. 17, the structure of an output matching circuit 340 according to a third embodiment is described. FIG. 17 is a diagram depicting one example of the structure of the output matching circuit 340 according to the third embodiment. As depicted in FIG. 17, the output matching circuit 340 includes, for example, a converter 341, a coupling capacitor 342, and a first filter circuit 343. The converter 341 and the coupling capacitor 342 of the output matching circuit 340 are identical to the converter 141 and the coupling capacitor 142 of the output matching circuit 140, and therefore their description is omitted.

The first filter circuit 343 is, for example, a circuit which makes a short circuit in a frequency band different from a transmission frequency band indicated by the RF signal RF2. The first filter circuit 343 has, for example, one end electrically connected to a node between the converter 341 (or the coupling capacitor 342) and the collector of a power amplifier element 320 (not depicted) and the other end connected to the ground. That is, the first filter circuit 343 derives the RF signal RF2 in the first frequency band to the ground.

The first filter circuit 343 includes an inductor 343a, a plurality of capacitors 343b, and a switch 343c for selectively and electrically connecting the inductor and one capacitor among the plurality of capacitors. The switch 343c may be, for example, a silicon-on-insulator switch. This allows the pass band to be adjusted by changing the resonant frequency of the first filter circuit 343.

Note that the output matching circuit 340 may further include a second filter circuit 344 and a transmission line 345. The transmission line 345 is similar to the transmission line 245 of the output matching circuit 240, and thus its description is omitted. The second filter circuit 344 includes an inductor 344a, a plurality of capacitors 344b, and a switch 344c for selectively and electrically connecting the inductor and one capacitor among the plurality of capacitors. The switch 344c may be, for example, a silicon-on-insulator switch. This allows the pass band to be adjusted by changing the resonant frequency of the second filter circuit 344. Further, since the resonant frequency can be adjusted in accordance with the electrical length and the characteristic impedance of the transmission line 345, losses in the power amplifier circuit can be suppressed.

Further, the first filter circuit 343 and the second filter circuit 344 are not limited to be configured to include an inductor, a plurality of capacitors, and a switch. For example, the first filter circuit 343 and the second filter circuit 344 may include a capacitor, a plurality of inductors, and a switch. In this case, the switch selectively connects the capacitor and one inductor among the plurality of inductors. This allows the pass band to be adjusted by changing the resonant frequency of the first filter circuit 343 and the second filter circuit 344.

CONCLUSION

The output matching circuit 140, 240 according to the exemplary embodiments of the present disclosure includes: the converter 141, 241 electrically connected to an output end of the power amplifier element 120, 220 to convert an impedance of the output end to an impedance higher than the impedance of the output end by magnetic coupling; and the first filter circuit 143, 243 electrically connected between the output end of the power amplifier element 120, 220 and the converter 141, 241 to make a short circuit in a frequency band different from a predetermined transmission frequency band. With this, in the power amplifier circuit 100, 200, losses in the pass band are suppressed.

Further, the output matching circuit 240 further includes: the second filter circuit 244 electrically connected between the output end of the power amplifier element 220 (not depicted) and the first filter circuit 243 to make a short circuit in a frequency band different from the predetermined transmission frequency band; and the transmission line 245 electrically connected between the first filter circuit 243 and the second filter circuit 244 and having a predetermined electrical length. With this, the power amplifier circuit 200 (not depicted) ensures attenuation in the pass band, and can suppress losses.

Further, the first filter circuit 243 of the output matching circuit 240 is configured so that a first resonant frequency of the first filter circuit 243 is lower than a second resonant frequency of the second filter circuit 244. With this, the first resonant frequency and the second resonant frequency are added and combined, and the frequency band to be attenuated can be widened.

Further, the first filter circuit 243 of the output matching circuit 240 is configured so that the first resonant frequency is in a range of a frequency band which is double a center frequency of the predetermined transmission frequency band, and the second filter circuit 244 is configured so that the second resonant frequency is in a range of a frequency band which is double the center frequency of the predetermined transmission frequency band. This allows the output matching circuit 240 to trap harmonic waves, which greatly affect the frequency characteristics, and thus its losses can be suppressed.

Further, the first filter circuit 143, 243 of the output matching circuit 140, 240 includes at least the inductor 143a, 243a and the capacitor 143b, 243b to be electrically connected in series. This allows the first filter circuit 143, 243 to be designed with less man-hours.

Further, the first filter circuit 343 of the output matching circuit 340 of a power amplifier circuit 300 (not depicted) includes the plurality of capacitors 343b, and includes the switch 343c for selectively and electrically connecting the inductor 343a to one capacitor among the plurality of capacitors 343b. This allows the power amplifier circuit 300 to adjust the pass band by changing the resonant frequency of the first filter circuit 343.

Further, the second filter circuit 244 of the output matching circuit 240 includes at least the inductor 244a and the capacitor 244b to be electrically connected in series. This allows the second filter circuit 244 to be designed with less man-hours.

Further, the second filter circuit 344 of the power amplifier circuit 300 includes the plurality of capacitors 344b, and includes the switch 344c for selectively and electrically connecting the inductor 344a to one capacitor among the plurality of capacitors 344b. This allows the power amplifier circuit 300 to adjust the pass band by changing the resonant frequency of the second filter circuit 344.

Further, the converter 141, 241, 341 of the output matching circuit 140, 240, 340 is configured to include a transmission line transformer. This allows the power amplifier circuit 100, 200, 300 to perform wide-band, low-loss impedance conversion.

Further, the power amplifier circuit 100, 200, 300 includes the output matching circuit 140, 240, 340 and the power amplifier element 120, 220, 320. The power amplifier circuit 100, 200, 300 can suppress losses in the pass band.

The above-described embodiments are to facilitate understanding of the present disclosure and are not intended for limiting the interpretation of the present disclosure. The present disclosure can be modified or improved without necessarily deviating from the gist thereof, and also include its equivalents. That is, those obtained by a person skilled in the art modifying the design of the embodiments as appropriate are also covered by the range of the present disclosure, as long as they include the characteristics of the present disclosure. The elements and their arrangement included in the embodiments are not limited to those exemplarily described, but can be modified as appropriate.

What is claimed is:

1. An output matching circuit comprising:
   a converter electrically connected to an output end of a power amplifier, the converter being configured to increase an impedance of the output end by magnetic coupling;
   a first filter circuit electrically connected between the output end of the power amplifier and the converter, the first filter circuit being configured to provide a short circuit for a first frequency band different than a predetermined transmission frequency band;
   a second filter circuit electrically connected between the output end of the power amplifier and the first filter circuit, the second filter circuit being configured to provide a short circuit for a second frequency band different than the predetermined transmission frequency band; and
   a transmission line electrically connected between the first filter circuit and the second filter circuit and having a predetermined electrical length.

2. The output matching circuit according to claim 1, wherein a first resonant frequency of the first filter circuit is lower than a second resonant frequency of the second filter circuit.

3. The output matching circuit according to claim 2, wherein:
   the first resonant frequency is in a frequency band that comprises a frequency that is double a center frequency of the predetermined transmission frequency band, and
   the second resonant frequency is in the frequency band that comprises the frequency that is double the center frequency of the predetermined transmission frequency band.

4. The output matching circuit according to claim 1, wherein the first filter circuit comprises an inductor and a capacitor electrically connected in series.

5. The output matching circuit according to claim 1, wherein the second filter circuit comprises an inductor and a capacitor electrically connected in series.

6. The output matching circuit according to claim 2, wherein the second filter circuit comprises an inductor and a capacitor electrically connected in series.

7. The output matching circuit according to claim 3, wherein the second filter circuit comprises an inductor and a capacitor electrically connected in series.

8. The output matching circuit according to claim 5, wherein the second filter circuit comprises a plurality of capacitors, and comprises a switch configured to selectively electrically connect the inductor to one of the plurality of capacitors.

9. The output matching circuit according to claim 1, wherein the converter comprises a transmission line transformer.

10. A power amplifier circuit comprising:
    the output matching circuit according to claim 1; and
    the power amplifier.

11. An output matching circuit comprising:
    a converter electrically connected to an output end of a power amplifier, the converter being configured to increase an impedance of the output end by magnetic coupling; and
    a first filter circuit electrically connected between the output end of the power amplifier and the converter, the first filter circuit being configured to provide a short circuit for a first frequency band different than a predetermined transmission frequency band,
    wherein the first filter circuit comprises an inductor and a plurality of capacitors, and comprises a switch configured to selectively electrically connect the inductor in series to one of the plurality of capacitors.

12. The output matching circuit according to claim 11, wherein a first resonant frequency of the first filter circuit is lower than a second resonant frequency of a second filter circuit.

13. The output matching circuit according to claim 12, wherein:
    the first resonant frequency is in a frequency band that comprises a frequency that is double a center frequency of the predetermined transmission frequency band, and
    the second resonant frequency is in the frequency band that comprises the frequency that is double the center frequency of the predetermined transmission frequency band.

14. The output matching circuit according to claim 11, wherein the converter comprises a transmission line transformer.

15. A power amplifier circuit comprising:
    the output matching circuit according to claim 11; and
    the power amplifier.

* * * * *